United States Patent
Wang et al.

(10) Patent No.: US 11,587,635 B2
(45) Date of Patent: Feb. 21, 2023

(54) SELECTIVE INHIBITION OF MEMORY

(71) Applicant: Micron Technology, Inc., Boise, ID (US)

(72) Inventors: Hongmei Wang, Boise, ID (US); Nevil N. Gajera, Meridian, ID (US); Mingdong Cui, Folsom, CA (US); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 244 days.

(21) Appl. No.: 17/013,089

(22) Filed: Sep. 4, 2020

(65) Prior Publication Data

US 2022/0076770 A1 Mar. 10, 2022

(51) Int. Cl.
  *G11C 29/38* (2006.01)
  *G11C 16/10* (2006.01)
  *G11C 16/08* (2006.01)
  *G11C 16/04* (2006.01)

(52) U.S. Cl.
  CPC .......... *G11C 29/38* (2013.01); *G11C 16/0483* (2013.01); *G11C 16/08* (2013.01); *G11C 16/10* (2013.01)

(58) Field of Classification Search
  None
  See application file for complete search history.

(56) References Cited

U.S. PATENT DOCUMENTS

| | | | | |
|---|---|---|---|---|
| 5,519,657 | A * | 5/1996 | Arimoto | G11C 29/80 365/201 |
| 9,613,715 | B2 * | 4/2017 | Frayer | G11C 29/08 |
| 10,446,226 | B2 | 10/2019 | Tortorelli et al. | |
| 2011/0002153 | A1 * | 1/2011 | Gravez | G11C 5/063 365/201 |
| 2014/0107822 | A1 * | 4/2014 | Chadwick | H01L 22/20 700/95 |
| 2019/0294368 | A1 * | 9/2019 | Hiraishi | G06F 12/0246 |
| 2020/0018538 | A1 | 1/2020 | Pfaffinger, Jr. et al. | |
| 2020/0159424 | A1 * | 5/2020 | Shah | G06F 3/0679 |
| 2020/0194403 | A1 | 6/2020 | Xiao | |
| 2020/0235117 | A1 * | 7/2020 | Horibe | H01L 27/11573 |

FOREIGN PATENT DOCUMENTS

| WO | 2019209456 A1 | 10/2019 |
|---|---|---|
| WO | 2020073184 A1 | 4/2020 |

* cited by examiner

*Primary Examiner* — Cynthia Britt
*Assistant Examiner* — Matthew W Wahlin
(74) *Attorney, Agent, or Firm* — Brooks, Cameron & Huebsch, PLLC

(57) ABSTRACT

An example apparatus can include a memory array and control circuitry. The memory array can include a first portion including a first plurality of memory cells. The memory array can further include a second portion including a second plurality of memory cells. The control circuitry can be configured to designate the first portion as active responsive to a determination that the first portion passed a performance test. The control circuitry can be configured to designate the second portion as inactive responsive to a determination that the second portion failed the performance test.

19 Claims, 3 Drawing Sheets

SELECTIVE INHIBITION OF MEMORY

TECHNICAL FIELD

The present disclosure relates generally to apparatuses and methods related to selective inhibition of memory.

BACKGROUND

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory (e.g., FeRAM), may maintain their stored logic state for extended periods of time even in the absence of an external power source. Volatile memory cells may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics.

DETAILED DESCRIPTION

Figure 1:
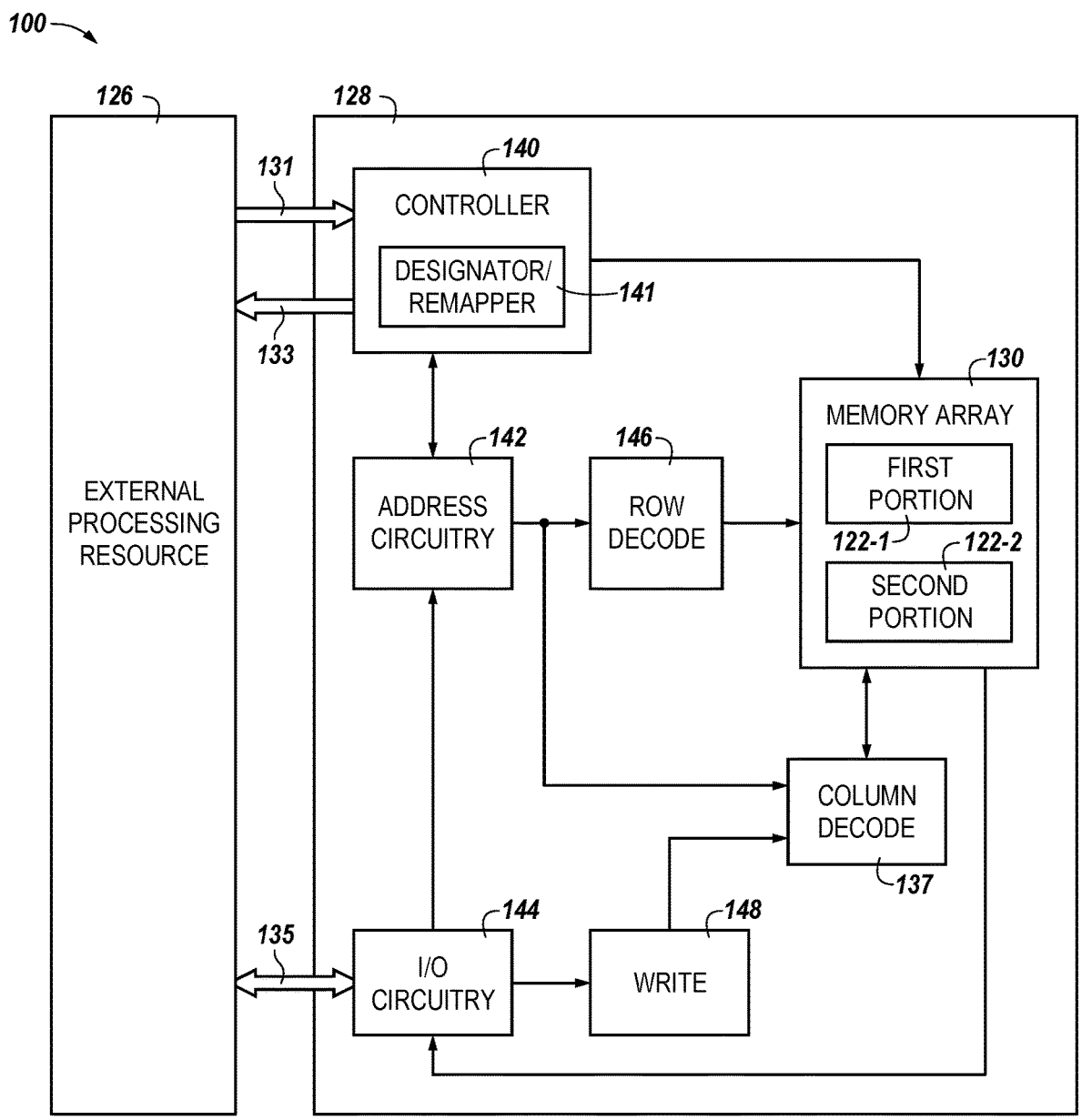
FIG. 1 is a block diagram of an apparatus in the form of a computing system including a memory device in accordance with a number of embodiments of the present disclosure.

An example apparatus can include a memory array and control circuitry. The memory array can include a first portion including a first plurality of memory cells. The memory array can further include a second portion including a second plurality of memory cells. The control circuitry can be configured to designate the first portion as active responsive to a determination that the first portion passed a performance test. The control circuitry can be further configured to designate the second portion as inactive responsive to a determination that the second portion failed the performance test.

The manufacture of memory arrays tends towards increasing density and reducing costs. Various 3-dimensional (3-D) memory devices (e.g., 3D NAND and/or 3D DRAM) comprise stacked configurations. 3D cross-point memory devices (e.g., dies), for example, comprise multiple decks (e.g., tiers) in a stacked configuration, which can increase density and reduce costs. Example 3D cross-point memory devices can include arrays of memory cells each comprising a select device and a storage material in series between a bit line and corresponding word line, such as a 3D XPoint device. Some 3D cross-point memory devices can comprise arrays of memory cells each comprising a single material (e.g., chalcogenide) that can serve as both a select device and storage device. Such cells may be referred to as self-selecting memory (SSM) cells. When such 3D cross-point memory devices are manufactured, they are typically subjected to testing in order to determine whether the device and/or internal memory array meets thresholds in various performance criteria. Such testing is herein referred to as "performance testing" or simply "testing." Performance testing can be used to determine the grade and/or price of memory devices before they are sold.

In various examples, each deck of an array is tested (e.g., sequentially tested). Performance testing an array deck can include testing structural aspects of the deck and/or electrical aspects of the deck. Testing can include executing a plurality of different subtests on, or using, each deck. Some of these subtests may allow the determination of whether a given deck is functional. Some of these subtests may allow the determination of a speed of a given deck. Some of these subtests may allow the determination of a grade (e.g., quality and/or efficacy) of a given deck of a memory device.

For example, among other processes, testing can include performing a bit error rate (BER) subtest on the deck to determine a BER associated with the deck. The determined BER associated with the deck can be compared to a threshold (e.g., desired) BER. In some cases, if the determined BER is higher than the threshold BER, the deck can be said to have failed the BER subtest of the performance test. Stated differently, the deck did not exceed the BER subtest threshold. Alternatively, if the determined BER is lower than the threshold BER, the deck can be said to have passed the BER subtest of performance test (e.g., the deck exceeded the BER subtest threshold). As previously discussed, testing can include executing a plurality of different subtests on, or using, each deck. Whether a particular deck passes or fails a performance test depends on the results of the individual subtests and may be manufacturer-specific and/or customer specific.

Commonly, an entire memory device (e.g., die) is designated as having failed a performance test if only a single one of its array decks failed the performance test and all others passed. In such cases, the failed die may be discarded. Thus, the already time-consuming and expensive nature of memory device manufacture becomes even more costly.

Performance testing can go beyond a simple determination of whether a particular deck passes or fails (or whether a memory device should be sold or discarded). For instance, memory devices may be graded based on their quality and priced for sale accordingly. Typically, the grade given to a memory device is determined by the lowest performing deck therein. For example, if an array includes one deck graded "tier 2" and all others graded "tier 1" (a higher grade than tier 2), the array as a whole may be graded "tier 2." Such grading practices can suppress a manufacturer's yield of highly-graded arrays, especially as the number of decks per array increases.

Embodiments of the present disclosure address these issues by salvaging memory arrays through selective inhibition. Thereby, embodiments herein are able to "re-claim" decks that may have otherwise been discarded. In some embodiments, for instance, decks that pass a performance test are designated as "active" and decks that do not pass a performance test are designated as "inactive." By so doing, embodiments of the present disclosure can avoid discarding an entire array when less than all of that array either does not perform or underperforms. Further, embodiments of the present disclosure can grade a memory array based on less than all of the decks therein (e.g., the active decks), allowing higher grades than previous approaches.

In some embodiments, for instance, a density of an array can be updated (e.g., downgraded) based on the designation of decks of active or inactive. Addresses of inactive decks can be re-scrambled such that logical addresses point only to physical addresses of active decks. It is noted that while the specific examples of decks and 3-D cross-point arrays are discussed herein, embodiments of the present disclosure are not so limited. Rather, the present disclosure relates to other memory arrays and the designation of "active" or "inactive" can be made to ranges of physical addresses that do not correspond to the specific example of decks.

FIG. 1 is a block diagram of an apparatus in the form of a computing system 100 including a memory device 128 in accordance with a number of embodiments of the present disclosure. As used herein, a memory device 128, controller 140, and memory array 130, might also be separately considered an "apparatus."

In this example, system 100 includes an external processing resource 126 coupled (e.g., connected) to memory device 128, which includes a memory array 130. It is noted that the example illustrated in FIG. 1 includes a single memory device 128, systems in accordance with the present disclosure can include multiple memory devices coupled to the external processing resource 126. External processing resource 126 can be a host system such as a personal laptop computer, a desktop computer, a digital camera, a smart phone, or a memory card reader, among various other types of hosts. External processing resource 126 can include a system motherboard and/or backplane and can include a number of processing resources (e.g., one or more processors, microprocessors, or some other type of controlling circuitry). The system 100 can include separate integrated circuits or both the external processing resource 126 and the memory device 128 can be on the same integrated circuit. The system 100 can be, for instance, a server system and/or a high performance computing (HPC) system and/or a portion thereof. In some embodiments, the system 100 can be a solid state drive (SSD) where the external processing resource 126 is a system controller coupled to multiple memory devices 128. The external processing resource 126 can be in communication with a host. In some embodiments, the external processing resource 126 can be a host processor where the controller 140 is an on-die controller, for instance. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a self-selecting memory (SSM) array, a 3-dimensional (3-D) X-point memory array, STT RAM array, PCRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines. Although a single array 130 is shown in FIG. 1, embodiments are not so limited. For instance, memory device 128 may include a number of arrays 130 (e.g., a number of banks of NAND flash cells, etc.).

The memory device 128 includes address circuitry 142 to latch address signals provided over a bus 135 (e.g., an I/O bus) through I/O circuitry 144. Address signals are received through address circuitry 142 and decoded by a row decoder 146 and a column decoder 137 to access the memory array 130. The address signals can also be provided to controller 140 (e.g., via address circuitry 142 and/or via a control bus 131). Data can be read from memory array 130 by sensing voltage and/or current changes on the data lines using sensing circuitry (not illustrated). The sensing circuitry can read and latch a page (e.g., row) of data from the memory array 130. The I/O circuitry 144 can be used for bi-directional data communication with external processing resource 126 over the I/O bus 135. The write circuitry 148 is used to write data to the memory array 130.

Memory controller 140, which may be referred to as bank control logic and/or a sequencer, decodes signals provided by control bus 131 from the external processing resource 126. These signals can include chip enable signals, write enable signals, and address latch signals that are used to control operations performed on the memory array 130, including data read, data write, and data erase operations. In various embodiments, the controller 140 is responsible for executing instructions from the external processing resource 126 and sequencing access to the array 130. The memory controller 140 can be a state machine, a sequencer, or some other type of controller.

The memory controller 140 may control the operation (e.g., read, write, re-write, refresh, discharge) of memory cells through the various components, for example, row decoder 146, column decoder 137, etc. In some cases, one or more of the row decoder 146 and column decoder 137 may be co-located with the controller (e.g., memory controller) 140. Memory controller 140 may generate row and column address signals in order to activate the desired access line and sense line. Memory controller 140 may also generate and control various voltages or currents used during the operation of a memory array. In general, the amplitude, shape, polarity, and/or duration of an applied voltage or current discussed herein may be adjusted or varied and may be different for the various operations discussed in operating the memory array. Furthermore, one, multiple, or all memory cells within memory array 130 may be accessed simultaneously; for example, multiple or all cells of memory array 130 may be accessed simultaneously during a reset operation in which all memory cells, or a group of memory cells, are set to a single logic state. The memory controller 140 can include circuitry (e.g., control circuitry) which is shown in FIG. 1 as "designator/remapper 141. The designator/remapper 141 can perform various processes, as described herein. It is noted that while the designator/remapper 141 is shown in FIG. 1 as being included in the memory controller 140, embodiments of the present disclosure are not so limited.

The memory array 130 can include a first portion 122-1 of a plurality of memory cells and a second portion 122-2 of a plurality of memory cells. The first portion 122-1 and the second portion 122-2 are sometimes referred to herein respectively as "first deck 122-1" and "second deck 122-2." While the example of FIG. 1 shows two memory decks, other configurations may include any number of decks. In some embodiments, one or more of the memory decks may include self-selecting memory cells that include a variable resistance (e.g., chalcogenide) material. In other embodiments, one or more of the memory decks 122-2, 122-1, may include FeRAM cells that include a ferroelectric material. In yet other embodiments, one or more of the memory decks 122-2, 122-1, may include CBRAM cells that include a metallic oxide or a chalcogenide material. Chalcogenide materials may, for example, include a chalcogenide glass such as, for example, an alloy of selenium (Se), tellurium (Te), arsenic (As), antimony (Sb), carbon (C), germanium (Ge), and silicon (Si). In some embodiment, a chalcogenide material having primarily selenium (Se), arsenic (As), and germanium (Ge) may be referred to as SAG-alloy. As will be appreciated to those of ordinary skill in the art, the first deck 122-1 can be positioned above a substrate and the second deck 122-2 can be positioned on top of the first deck 122-2, though embodiments of the present disclosure are not so limited.

A cross-point architecture may offer relatively high-density data storage with lower production costs compared to some other memory architectures. For example, a memory array with a cross-point architecture may have memory cells with a reduced area and, resultantly, may support an increased memory cell density compared to some other architectures.

Figure 2:
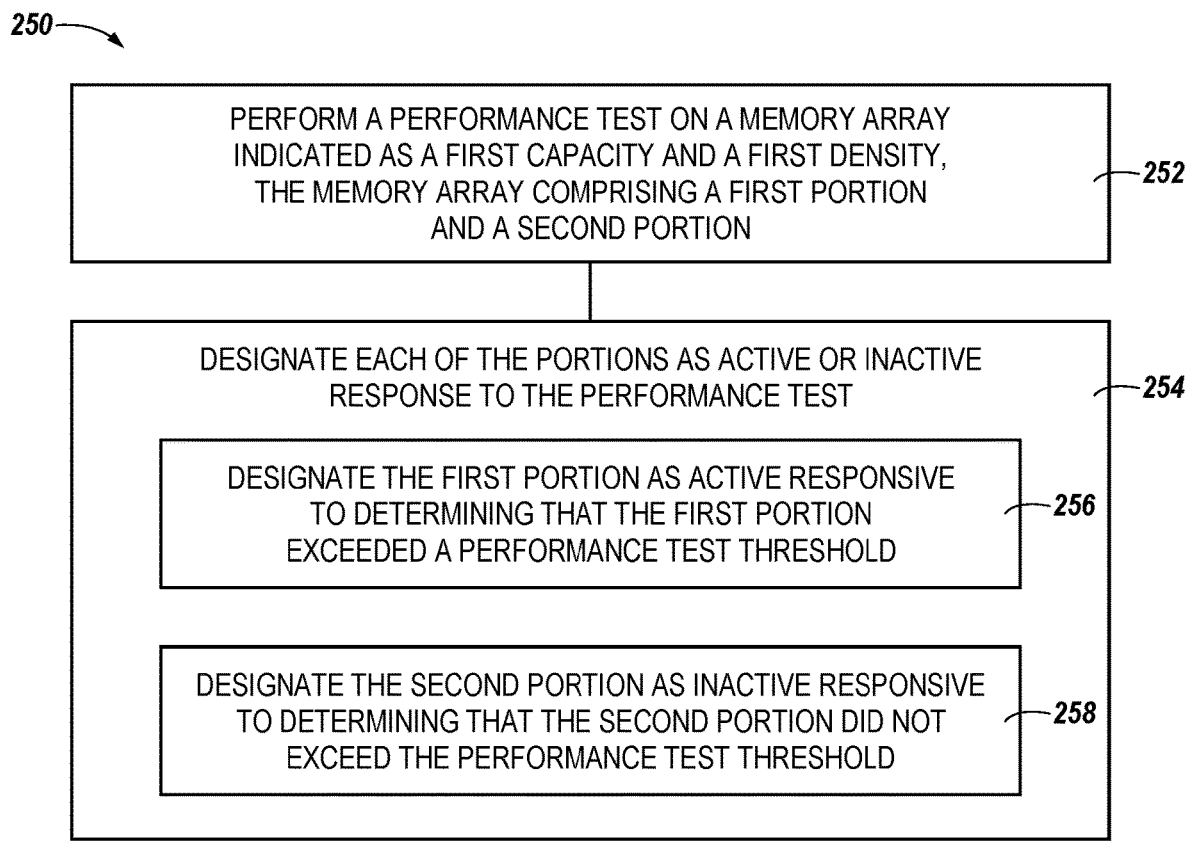
FIG. 2 illustrates a method for selective inhibition of memory in accordance with a number of embodiments of the present disclosure.

FIG. 2 illustrates a method 250 for selective inhibition of memory in accordance with a number of embodiments of the present disclosure. The method 250 can be implemented by control circuitry, for instance (e.g., the designator/remapper 141, previously described in connection with FIG. 1). In some embodiments, the control circuitry is located on a die of the memory array. In some embodiments, the control circuitry is included in a controller, such as a system controller or memory controller (e.g., analogous to the memory controller 140, previously described in connection with FIG. 1). For instance, a controller may execute a set of codes to control the functional elements of the device to perform the functions described below. The controller may perform aspects of the functions described below using hardware and/or firmware.

At 252, the method 250 can include performing a performance test on a memory array indicated as a first (e.g., intended) capacity and a first (e.g., intended) density, the memory array comprising a plurality of portions, including a first portion comprising a first plurality of memory cells and a second portion comprising a second plurality of memory cells. As previously discussed, the first portion can refer to a first deck of the memory array, and the second portion can refer to a second deck of the memory array, though it is noted that embodiments herein are not so limited. In some embodiments, for instance, portions can refer to regions of a memory array. For example, some embodiments can include selectively inhibiting a portion of a memory array that is smaller than a deck.

A memory array may be intended to have a particular capacity. Capacity refers to a storage space, which can be measured in bytes. For example, an array may be manufactured such that, if manufactured as intended, it has a capacity (e.g., a first capacity) of 256 gigabytes (Gb). A memory array may be intended to have a particular density. Density refers to an amount of capacity in a given area or space. For example, an array may be manufactured such that, if manufactured as intended, it has a density of 0.62 Gb per square millimeter.

As previously discussed, a performance test can be performed on an array. Performance testing may be carried out in association with the manufacture of the array (e.g., upon completion of the manufacture). Performance testing can include performing a plurality of subtests on, or using, the array. Subtests can include, for example, high temperature tests, low temperature tests, temperature cycling tests, power cycling tests, shock tests, vibration tests, BER tests, and/or ongoing reliability tests, among others. Results of the performance test can be communicated to, and received by, the control circuitry described herein.

At 254, the method 250 can include designating each of the plurality of portions as active or inactive responsive to the performance test. If a deck exceeds a performance test threshold, the control circuitry can designate it as active. If a deck does not exceed the performance test threshold, the control circuitry can designate it as inactive. Designating a deck as inactive can include placing the deck in an inhibited state. Placing a deck in an inhibited state can include modifying (or maintaining) a fuse setting of the deck designated as inactive. Designating a deck as active can include modifying (or maintaining) a fuse setting of the deck indicated as active, such that the fuse setting of the active deck is different than the fuse setting of the inactive deck. Accordingly, designating can include, at 256, designating the first portion as active responsive to determining that the first portion exceeded a performance test threshold, and, at 258, designating the second portion as inactive responsive to determining that the second portion did not exceed the performance test threshold.

A deck exceeding—or not exceeding—the performance test threshold can depend on a quantity and/or a type of the performance subtests that the deck either passed or failed. In some embodiments, not exceeding the performance test threshold can depend on a degree to which the deck failed one or more of the performance subtests. When a deck is indicated as inactive, the control circuitry can re-map an address (e.g., a portion of a physical address) corresponding to the second portion (e.g., a deck address corresponding to the second deck) such that the address maps to the first portion. Re-mapping is described further below in connection with FIG. 3.

Once the control circuitry designates decks as either active or inactive, the method 250 can include modifying information describing the array. For instance, in some embodiments, the memory array can be indicated as having a reduced (e.g., second) capacity. A reduced capacity refers to a capacity of the decks designated as active. If a deck of the array was designated as inactive, the array may no longer be indicated as having the first capacity, discussed above. For example, an array may be manufactured such that, if manufactured as intended, it has a capacity (e.g., a first capacity) of 256 Gb. If, however, one 64 Gb deck of the array was designated as inactive, the reduced (e.g., second) capacity can be indicated to be 192 Gb.

The method 250 can include indicating the memory array as having a reduced (e.g., second) density responsive to designating the plurality of portions. A reduced density refers to an amount of capacity of the decks designated as active in a given area or space. If a deck of the array was designated as inactive, the array may no longer be indicated as having the intended (e.g., first) density, discussed above. For example, an array may be manufactured such that, if manufactured as intended, it has a density of 0.62 Gb per square millimeter. If, however, half of the decks of the array were designated as inactive, the reduced (e.g., second) density can be indicated to be 0.31 Gb per square millimeter.

The method 250 can include grading the memory array based on a subset of the plurality of portions of the memory array designated as active. In contrast to previous approaches, where grading may be based on all decks of an array, embodiments herein can grade an array based on less than all decks of an array (e.g., only active decks). Typically, in past approaches, the grade given to a memory array is determined by the lowest performing deck therein. For example, if an array includes one deck graded "tier 2" and all others graded "tier 1" (a higher grade than tier 2), the array as a whole may be graded "tier 2." In accordance with embodiments herein, the lowest performing deck (or decks) can be designated as inactive and grading may not take them into account. Thus, in the example above, the "tier 2" deck can be designated as inactive, rendering the rest of the decks, and thus the array, "tier 1."

Indicating capacities, densities, and/or grades of memory arrays can be performed based on a variety of external factors such as sales, revenue, customer needs, and/or customer preferences, for instance. In some embodiments, if a higher grade of array is preferable to increased capacity and/or density, the performance test threshold for designating decks as inactive is reduced. In some embodiments, if an array having increased capacity and/or density is preferable to a higher grade, the performance test threshold for designating decks as inactive is increased. Thus, the method 250 can include assigning, based on the subset of the plurality of portions of the memory array designated as active, a reduced (e.g., second) density and higher (e.g., first) grade or a higher (e.g., intended) density and a lower (e.g., second) grade.

Figure 3A:
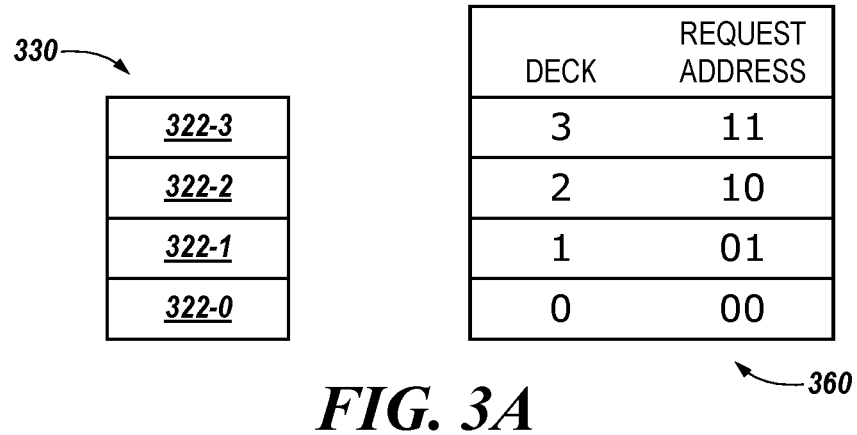
FIG. 3A illustrates a memory array having a plurality of decks and a corresponding lookup table in accordance with a number of embodiments of the present disclosure.
Figure 3B:
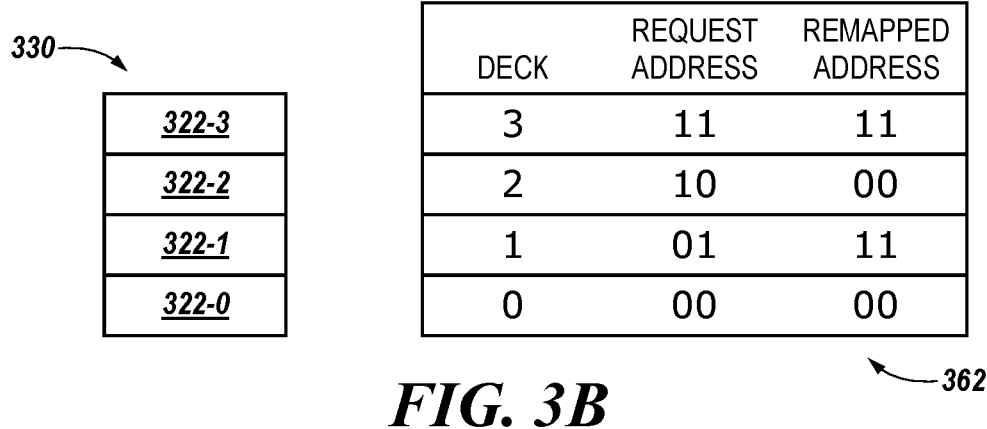
FIG. 3B illustrates the memory array and the corresponding lookup table after a remapping in accordance with a number of embodiments of the present disclosure.

FIG. 3A illustrates a memory array 330 having a plurality of decks and a corresponding lookup table 360 in accordance with a number of embodiments of the present disclosure. FIG. 3B illustrates the memory array and the corresponding lookup table after a remapping in accordance with a number of embodiments of the present disclosure. FIGS. 3A and 3B may be cumulatively referred to herein as "FIG. 3."

The memory array 330 can be part of a 3D architecture, with a number of decks vertically stacked on each other. The example array 330 shown in FIG. 3 includes four decks: a zeroth deck 322-0, a first deck 322-1, a second deck 322-2, and a third deck 322-3 (referred to herein as deck 0, deck 1, deck 2, and deck 3, respectively). It is noted that embodiments of the present disclosure do not limit memory arrays to a particular type, much less to a particular number of decks.

FIG. 3A illustrates the memory array 330 and its corresponding table 360 before any of the decks 0, 1, 2, 3 are designated as active or inactive. As shown in the table 360, each deck 0, 1, 2, 3 corresponds to a respective deck address. Deck address 00 corresponds to deck 0, deck address 01 corresponds to deck 1, deck address 10 corresponds to deck 2, and deck address 11 corresponds to deck 3. A logical address received in association with a command from a controller can include the deck address, which can correlate to a physical address range (e.g., one of the decks 0, 1, 2, 3).

In an example, a performance test is performed on the array 330, the results of which lead to control circuitry indicating deck 1 and deck 2 as inactive, and control circuitry indicating deck 0 and deck 3 as active. The table 362 shown in FIG. 3B includes re-mapped addresses following the designation of deck 1 and deck 2 as inactive.

As shown in FIG. 3B, deck address 00 still corresponds to deck 0, and deck address 11 still corresponds to deck 3. Decks 1 and 2, however, have been re-mapped. As shown in FIG. 3B, deck address 11 now corresponds to deck 1 in addition to deck 3, and deck address 00 now corresponds to deck 2 in addition to deck 0. In some embodiments, the re-mapping is stored in non-volatile memory. In some embodiments, the re-mapping is stored in a dedicated fuse register within controller (e.g., the controller 140, previously described in connection with FIG. 1). written into a fuse table, for instance. In some embodiments, the fuses can be set (e.g., loaded) upon powerup. In some embodiments, a controller can read the re-mapping data from the array upon powerup to determine the re-mapping of the array.

It should be noted that the methods described above describe possible implementations, and that the operations and the steps may be rearranged or otherwise modified and that other implementations are possible. Furthermore, embodiments from two or more of the methods may be combined.

The devices discussed herein, including memory device, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a," "an," or "a number of" something can refer to one or more of such things. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. An apparatus, comprising:
   a memory array comprising:
      a first portion comprising a first plurality of memory cells, wherein the first portion is a first deck of the memory array; and
      a second portion comprising a second plurality of memory cells, wherein the second portion is a second deck of the memory array; and
   control circuitry configured to:
      designate the first portion as active responsive to a determination that the first portion passed a performance test; and
      designate the second portion as inactive responsive to a determination that the second portion failed the performance test.

2. The apparatus of claim 1, wherein the control circuitry is configured to re-map an address corresponding to the second portion such that the address maps to the first portion.

3. The apparatus of claim 1, wherein the control circuitry is configured to place the second portion in an inhibited state responsive to the determination that the second portion failed the performance test.

4. The apparatus of claim 1, wherein the control circuitry is included in a system controller coupled to the first portion and the second portion.

5. The apparatus of claim 1, wherein the control circuitry is on a die of the memory array.

6. The apparatus of claim 1, wherein the control circuitry is configured to set a circuit fuse to a first setting to designate the second portion as inactive.

7. The apparatus of claim 6, wherein the control circuitry is configured set a circuit fuse to a second setting to designate the first portion as active.

8. An apparatus, comprising:
   a memory array comprising:
      a plurality of portions, each comprising a plurality of memory cells, wherein each of the plurality of portions is a respective deck of the memory array; and
   control circuitry of a system controller coupled to each of the plurality of portions, wherein the control circuitry is configured to:
      receive results of a performance test performed on each of the plurality of portions;
      designate any portions of the plurality of portions that failed the performance test as inactive using a first fuse setting; and
      designate any portions of the plurality of portions that passed the performance test as active using a second fuse setting.

9. The apparatus of claim 8, wherein the control circuitry is configured to designate any portions of the plurality of portions as inactive without designating the memory array as inactive.

10. The apparatus of claim 8, wherein the control circuitry is configured to re-map any address corresponding to any portions of the plurality of portions designated as inactive such that the address maps to a portion of the plurality of portions designated as active.

11. The apparatus of claim 10, wherein the control circuitry is configured to write the re-mapping to a fuse table.

12. A method, comprising:
   performing a performance test on a memory array indicated as having a first capacity and a first density, the memory array comprising a plurality of portions, including:
      a first portion comprising a first plurality of memory cells, wherein the first portion is a first deck of the memory array; and
      a second portion comprising a second plurality of memory cells, wherein the second portion is a second deck of the memory array;
   designating each of the plurality of portions as active or inactive responsive to the performance test, wherein designating the plurality of portions includes:

designating the first portion as active responsive to determining that the first portion exceeded a performance test threshold; and designating the second portion as inactive responsive to determining that the second portion did not exceed the performance test threshold.

13. The method of claim 12, wherein performing the performance test includes determining a bit error rate associated with each of the plurality of portions.

14. The method of claim 13, wherein the method includes determining that the second portion did not exceed the performance test threshold responsive to a determination that the determined bit error rate associated with the second portion exceeds a bit error rate threshold.

15. The method of claim 12, wherein the method includes indicating the memory array as having a second capacity responsive to designating the plurality of portions.

16. The method of claim 12, wherein the method includes indicating the memory array as having a second density responsive to designating the plurality of portions.

17. The method of claim 12, wherein the method includes grading the memory array based on a subset of the plurality of portions of the memory array designated as active.

18. The method of claim 17, wherein the method includes assigning, based on the subset of the plurality of portions of the memory array designated as active, a grading of one of:

the first density and a second grade; and a second density and a first grade.

19. The method of claim 12, wherein the method includes setting the performance test threshold based on a customer preference.

\* \* \* \* \*